United States Patent
Hu et al.

(10) Patent No.: US 8,105,905 B2
(45) Date of Patent: Jan. 31, 2012

(54) CONFIGURATION AND METHOD TO FORM MOSFET DEVICES WITH LOW RESISTANCE SILICIDE GATE AND MESA CONTACT REGIONS

(75) Inventors: Yongzhong Hu, Cupertino, CA (US); Sung-Shan Tai, San Jose, CA (US)

(73) Assignee: Alpha & Omega Semiconductor, Ltd. (BM)

( * ) Notice: Subject to any disclaimer, the term of this patent is extended or adjusted under 35 U.S.C. 154(b) by 0 days.

(21) Appl. No.: 12/927,177

(22) Filed: Nov. 8, 2010

(65) Prior Publication Data

US 2011/0124167 A1    May 26, 2011

Related U.S. Application Data

(62) Division of application No. 11/338,019, filed on Jan. 24, 2006, now Pat. No. 7,829,941.

(51) Int. Cl.
*H01L 21/336* (2006.01)

(52) U.S. Cl. .............................. 438/270; 257/E21.409
(58) Field of Classification Search ............. 438/270; 257/E21.409

See application file for complete search history.

(56) References Cited

U.S. PATENT DOCUMENTS

| | | | |
|---|---|---|---|
| 6,291,310 B1 | 9/2001 | Madson et al. | |
| 2003/0047778 A1 | 3/2003 | Nakamura et al. | |
| 2003/0085422 A1 | 5/2003 | Amali et al. | |
| 2005/0173760 A1* | 8/2005 | Spring | 257/341 |
| 2006/0071268 A1* | 4/2006 | Tai et al. | 257/330 |

FOREIGN PATENT DOCUMENTS

| | | |
|---|---|---|
| TW | I248172 | 1/2006 |
| TW | I249770 | 2/2006 |

* cited by examiner

*Primary Examiner* — Lex Malsawma
(74) *Attorney, Agent, or Firm* — Bo-In Lin

(57) ABSTRACT

A novel integration scheme for forming power MOSFET, particularly forming salicides for both gate and mesa contact regions, as well as using multiple energy contact implants through the salicided layer to form conductive body contacts which short to the source region by the salicides.

6 Claims, 9 Drawing Sheets

CONFIGURATION AND METHOD TO FORM MOSFET DEVICES WITH LOW RESISTANCE SILICIDE GATE AND MESA CONTACT REGIONS

This is a Divisional Application and claims the Priority Date of a previously filed application Ser. No. 11/338,019 filed on Jan. 24, 2006 now U.S. Pat. No. 7,829,941 by identical common inventors of this Application. The disclosures made in application Ser. No. 11/338,019 are hereby incorporated by reference in this Patent Application.

BACKGROUND OF THE INVENTION

1. Field of the Invention

The invention relates generally to the semiconductor power devices. More particularly, this invention relates to an improved and novel device configuration and manufacturing process to provide silicide gate and mesa contact regions to reduce gate resistance and source contact resistance and body contact resistance of a MOSFET power device.

2. Description of the Prior Art

With the advent of high efficiency metal oxide semiconductor (MOS) gate devices for hand held electronics power-switching applications leads to a more stringent requirement to further reduce the on-resistance of the MOSFET device. In order to satisfy this requirement, several configurations have been disclosed in attempt to reduce the resistance of a MOSFET device.

In U.S. Pat. No. 6,855,601, Gajda discloses a device configuration for reducing the gate resistance for a power semiconductor device with trenched gates. In this device the trenched gate protrudes upwardly from the trench in the form of a silicide upstanding part which is of a metal silicide material between its top and sidewalls above the level of the body surface. As shown in FIG. 1A, the gate dielectric layer at least adjacent to the channel-accommodating region is separated from the metal silicide material by at least the semiconductor part of the gate and by the protrusion of the silicide part upward above the level of the body surface. The protrusion of the upstanding silicide part above the level of the body surface permits the inclusion of a substantial volume of silicide to reduce gate resistance without impacting other device performing features. In the device disclosed by Gajda, the protrusion of the silicide upstanding part of the gate above the level of the body surface may be larger than half the width of the trench. This protrusion may typically be as large as the width of the trench or larger, for example several times larger than the width of the trench. Implementation of the special device configuration and manufacturing processes reduction of gate resistance is accomplished. However, the invention as disclosed requires extensive process development and integration complexity. Furthermore, the invention as disclosed is not yet able to provide an effective solution to address the issues of reducing the source contact resistance and body contact resistance.

In a published paper entitled "A High Performance Self-Aligned UMOSFET with a Vertical Trench Contact Structure" (IEEE Transactions on Electronic Devices, Vol. 41, No. 3, May 1994), Matsumoto et al. disclose a configuration to reduce the source contact resistance. As shown in FIG. 1B, the configuration involves the opening of vertical trench contact to the source. Such device configuration may be useful for addressing the issue of scaling trench MOSFET so that the reduced source contact area would not limit device pitch reduction. However it does not provide a reduced source contact resistance as low as that is commonly demanded by many different low resistance applications. The disclosed UMOSFET in the paper is also not effective for reducing the gate resistance.

Therefore, a need still exists in the art of power semiconductor device design and manufacture to provide new manufacturing method and device configuration in forming the power devices such that the above discussed problems and limitations can be resolved.

SUMMARY OF THE PRESENT INVENTION

It is therefore an aspect of the present invention to provide a new and improved semiconductor power device implemented with a process of forming salicides for both gate and mesa contact regions of maximum contact area. Additionally, the process applies multiple energy contact implantations through the mesa salicides and self-aligned and to the spacer, to form conductive body contacts that is shorted to the source region by the salicides. The processes as disclosed in this invention provide the advantage that the resistivity of the gate and the source contacts as well as the body contacts is simultaneously reduced. The limitations and difficulties as discussed above for the conventional device are therefore resolved.

Specifically, it is an aspect of the present invention to provide improved MOSFET devices manufactured with a trenched gate by implementing a new and unique manufacturing process. The process provides a first and second salicided layer on both the trenched gate and the mesa areas for contacting the source and body regions with the source metal. The gate resistance and the source contact resistance as well as the body contact resistance are all reduced.

Briefly in a preferred embodiment this invention discloses trenched metal oxide semiconductor field effect transistor (MOSFET) device includes a trenched gate surrounded by a source region encompassed in a body region above a drain region disposed on a bottom surface of a substrate. The MOSFET device further includes a source contact opening and a gate opening opened through a protective insulation layer to fill in contact metal therein to contact the source and the gate of the MOSFET device. The MOSFET device further includes a salicided layer disposed between the body region and a source-body contact metal in a mesa contact area and a salicided layer between the gate and a gate contact metal whereby a resistance of the MOSFET cell is reduced. In a preferred embodiment, the MOSFET device further includes a contact dopant layer under the salicided layer below the source metal contact for electrically short to the body region. In a preferred embodiment, the salicided layer is a TiSi2 layer. In a preferred embodiment, the MOSFET device further includes a contact dopant layer to connect to the body region under the salicided layer below the source-body contact metal formed with multi-energy implantations through the salicided layer for electrically short to the source region. In a preferred embodiment, the salicided layer disposed on top of the trenched gate includes a first salicided layer and a second salicided layer and the salicided layer on disposed in the mesa areas includes a second salicided layer. In a preferred embodiment, the MOSFET device further includes a portion of the first salicided layer disposed on top of the trenched gate and below an insulation oxide layer wherein the trenched gate having a top portion surrounded by a hardmask layer and a padded oxide layer disposed on top of the hardmask layer. In a preferred embodiment, the salicided layer includes a first salicided layer disposed on top of the trenched gate with an upper portion of the trenched gate surrounded by a hardmask layer and a padded oxide layer, and the salicided layer further includes a second salicided layer disposed on the mesa area in a contact opening opened through the hardmask layer and the padded oxide layer.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
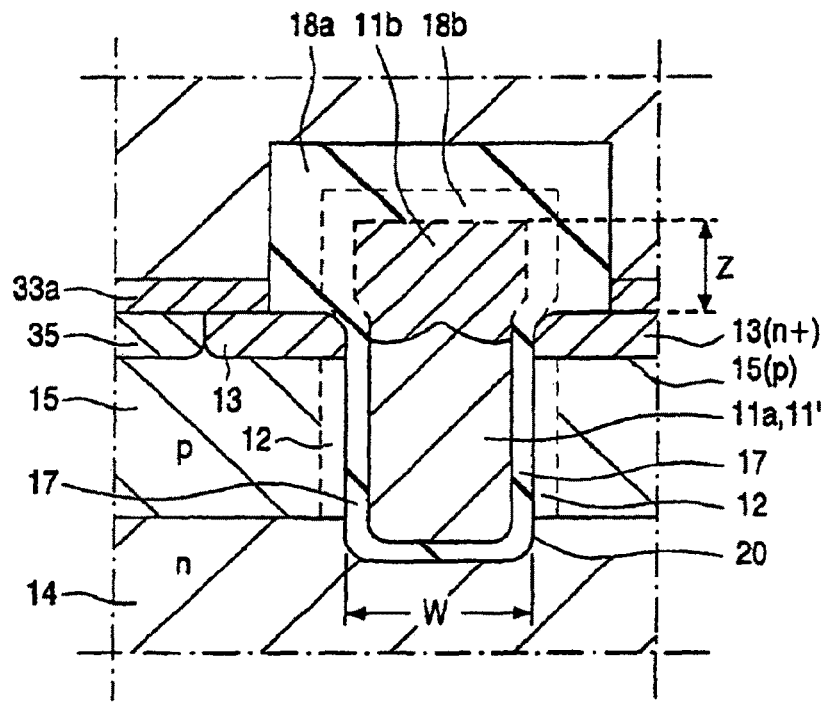
FIG. 1A is a cross sectional view of a conventional trenched MOSFET device implemented with a salicided gate contact.
Figure 1B:
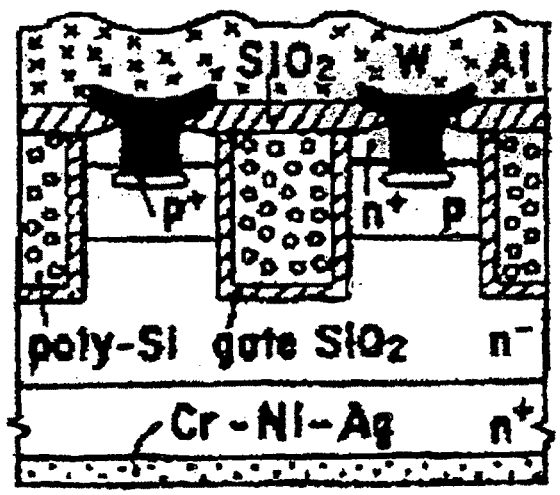
FIG. 1B shows another conventional semiconductor power device constitutes a self-aligned UMOSFET with reduced on-resistance.
Figure 2:
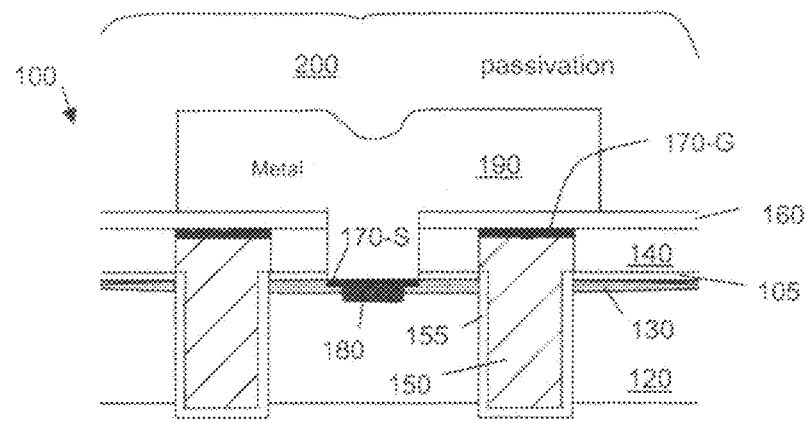
FIG. 2 is a cross sectional view of a trenched MOSFET device implemented with salicided gate and gate contact areas and mesa contact areas to form low-resistivity source contacts, body contacts and transistor gate.

Referring to FIG. 2 for a cross sectional view of a trenched MOSFET device 100. The trenched MOSFET device 100 is supported on a substrate formed with an epitaxial layer 110. Encompassed in the epitaxial layer 110 are a body layer 120 and a source layer 130 on top of the body layer 120. Covering over the top surface of the substrate is pad oxide layer 105 covered by a hard mask layer 140. The trenched MOSFET device 100 further includes trenched gates 150 disposed in the trenches opened through the hard mask layer 140 and the oxide pad layer 105 and extends over the source layer 130, the body layer 120 into the epitaxial layer 110. The trenched gates are composed of polysilicon filling in the trenches and a salicided gate and gate-contact layer 170-G covering over the top of the polysilicon gates 150. Furthermore, the salicided layer is simultaneously formed in the mesa regions such that the mesa regions also have a reduced resistivity.

The MOSFET device 100 further includes an oxide isolation layer 160 covering over the hard mask layer 140 and the salicided gate-contact layer. A plurality of source-body contact openings are opened through the oxide insulation layer 160, the hard mask layer 140 and the oxide pad layer 105 to reach the source regions 130. The source contact openings are filling with metal contact 190 to contact a contact doped region 180 formed by applying a multiple energy implantations of contact dopant ions through the source-body contact openings. The MOSFET device may have an option to be further protected with an passivation layer 200 covering the patterned contact metal layer 190 wherein the patterned contact metal layer is formed to contact the source-body contact regions 180 covering with a salicided mesa contact layer 170-S. The patterned metal layer further forms electrical contact to the trenched gate 150 in gate contact openings (not shown).

The device configuration with salicided gate has very low gate resistance. This new device configuration enables the fast switching operations because of the low gate charge. The processing steps also provide salicided mesa regions including source and body contacts. Maximum salicided contact area and low contact resistance are achieved thus yielding excellent transistor Rdson values.

Figure 3A:
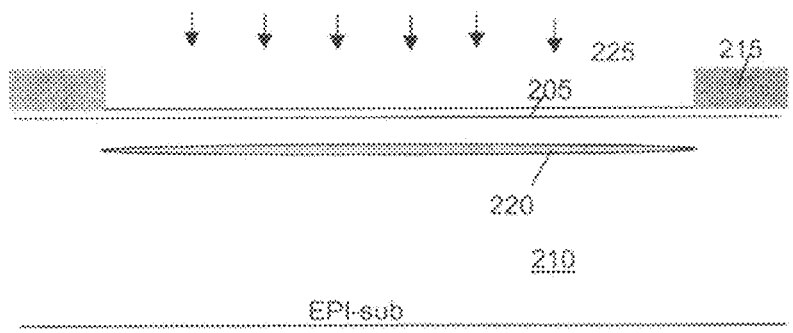
FIG. 3A to 3V are a serial of cross sectional views for showing the manufacturing processes of a MOSFET device of this invention.
Figure 3B:
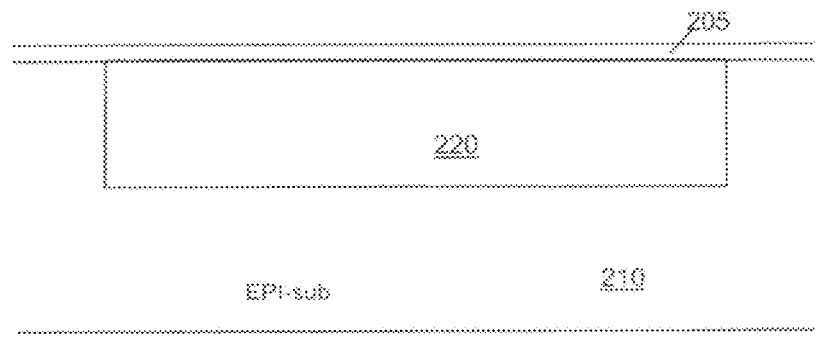
Figure 3C:
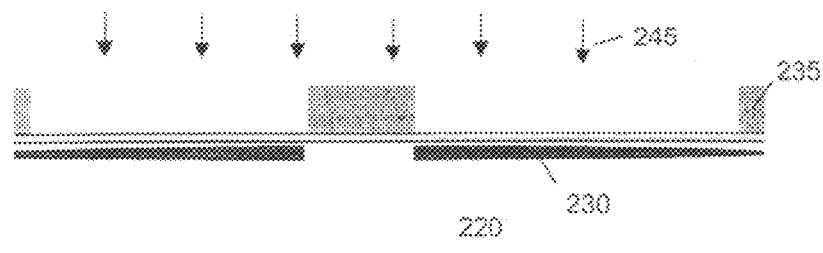
Figure 3D:
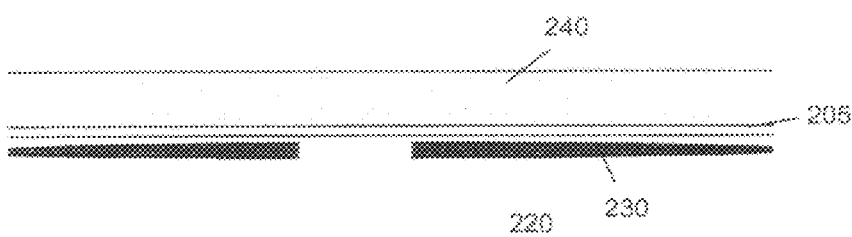
Figure 3E:
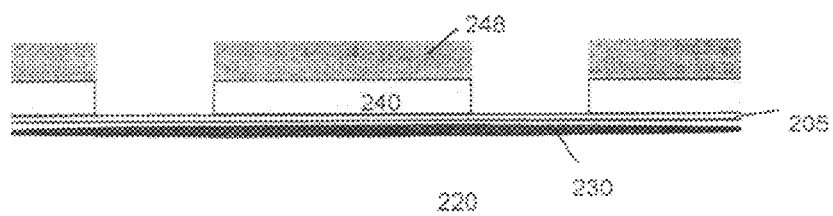
Figure 3F:
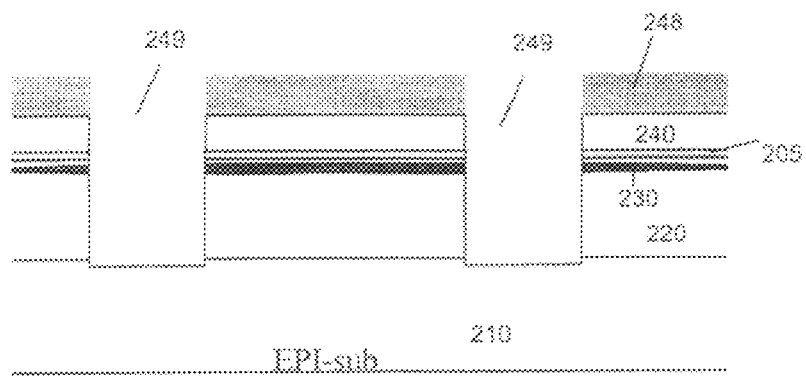
Figure 3G:
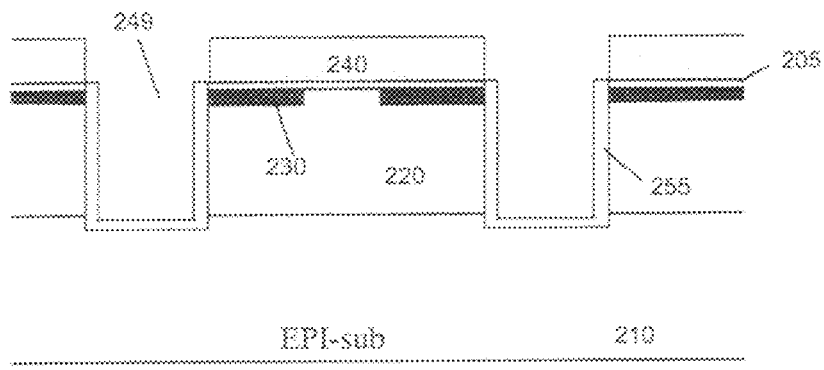
Figure 3H:
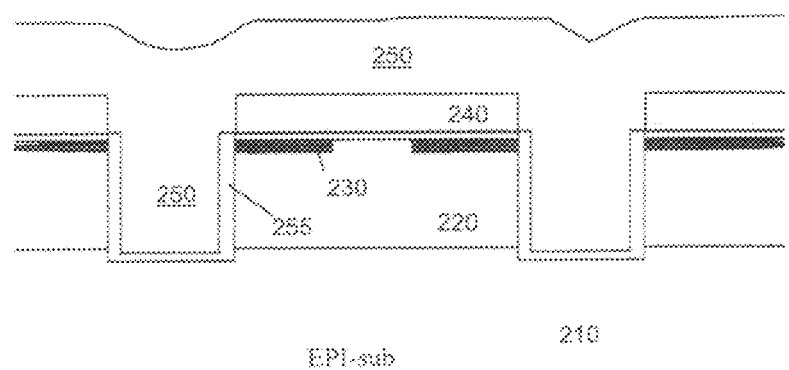
Figure 3I:
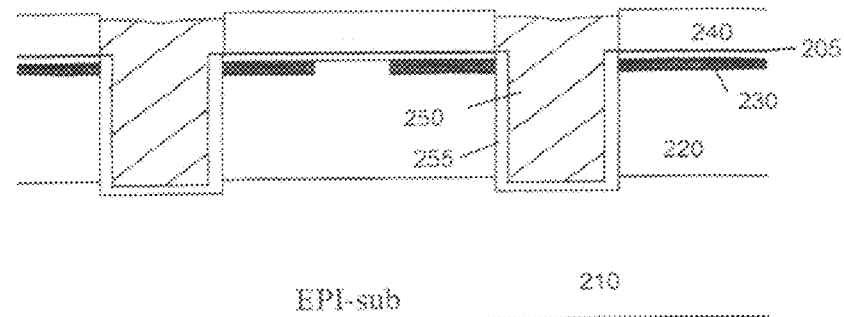
Figure 3J:
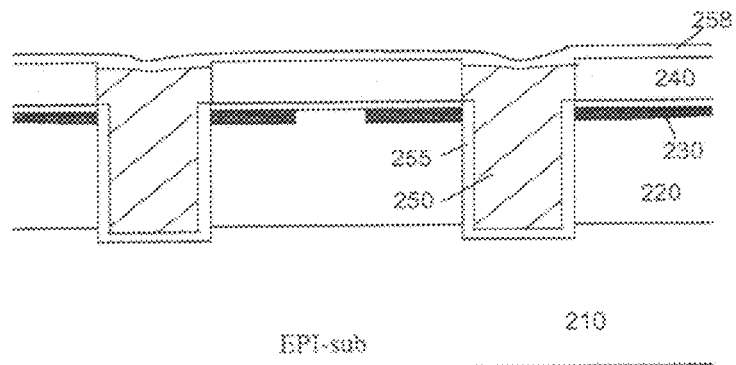
Figure 3K:
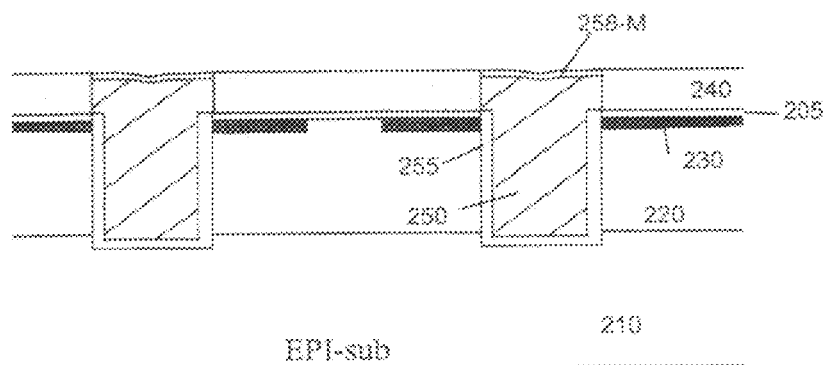
Figure 3L:
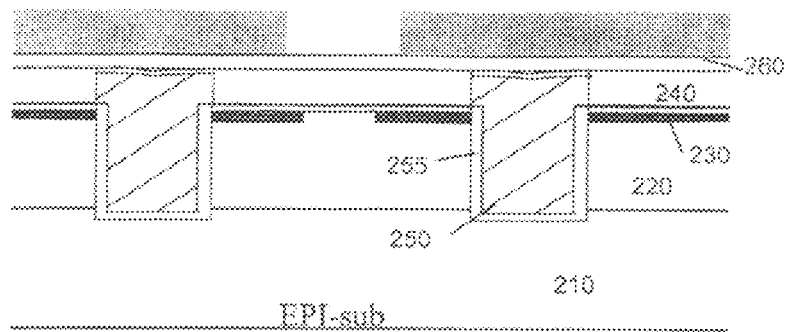
Figure 3M:
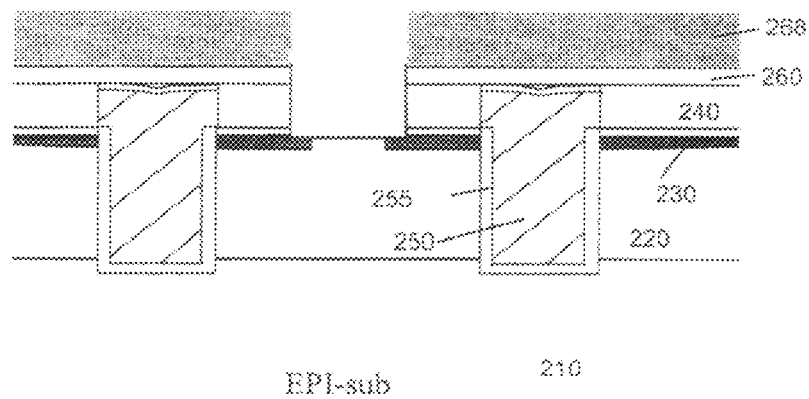
Figure 3N:
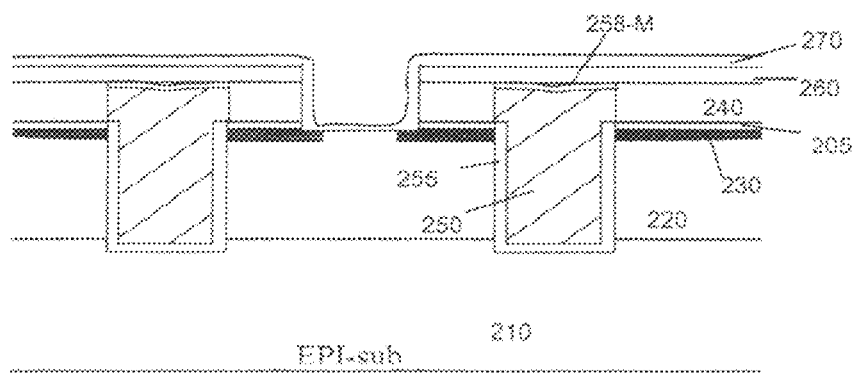
Figure 3O:
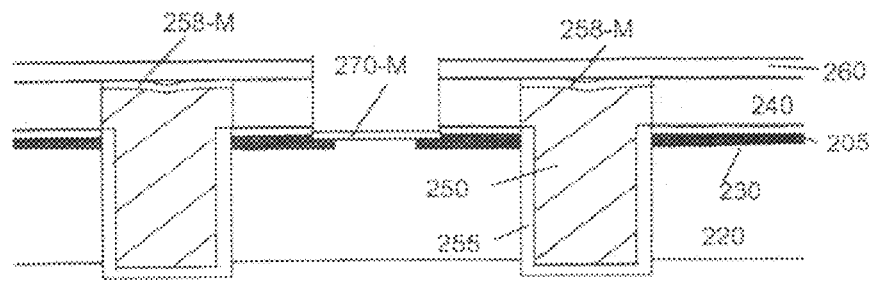
Figure 3P:
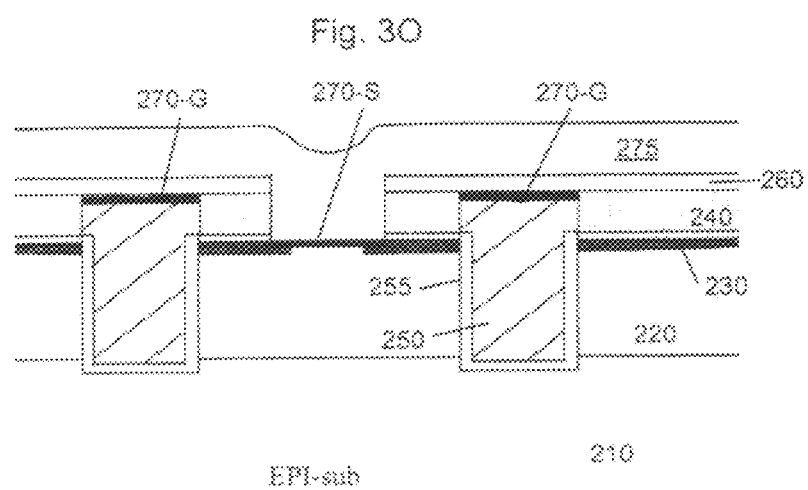
Figure 3Q:
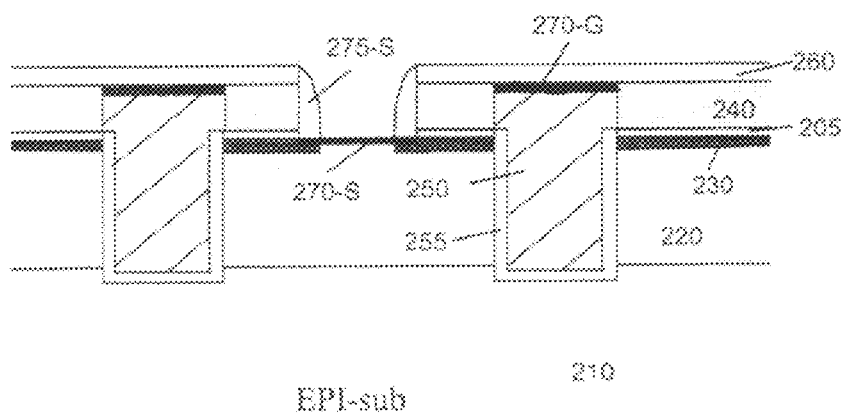
Figure 3R:
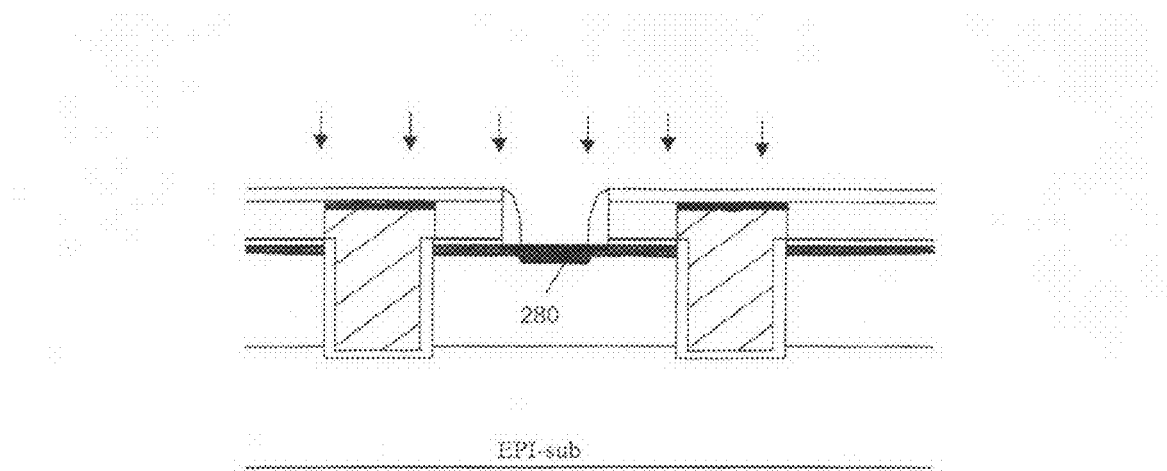
Figure 3S:
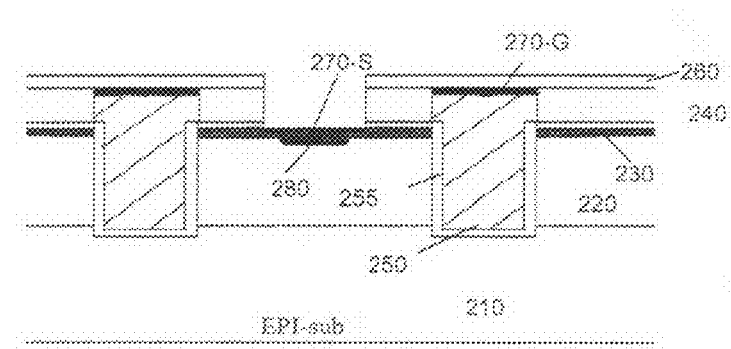
Figure 3T:
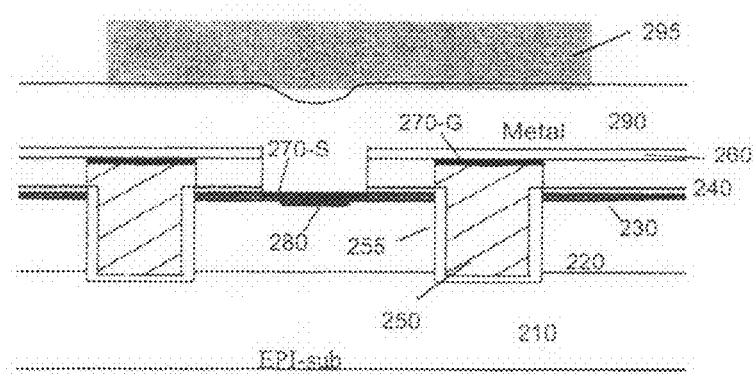
Figure 3U:
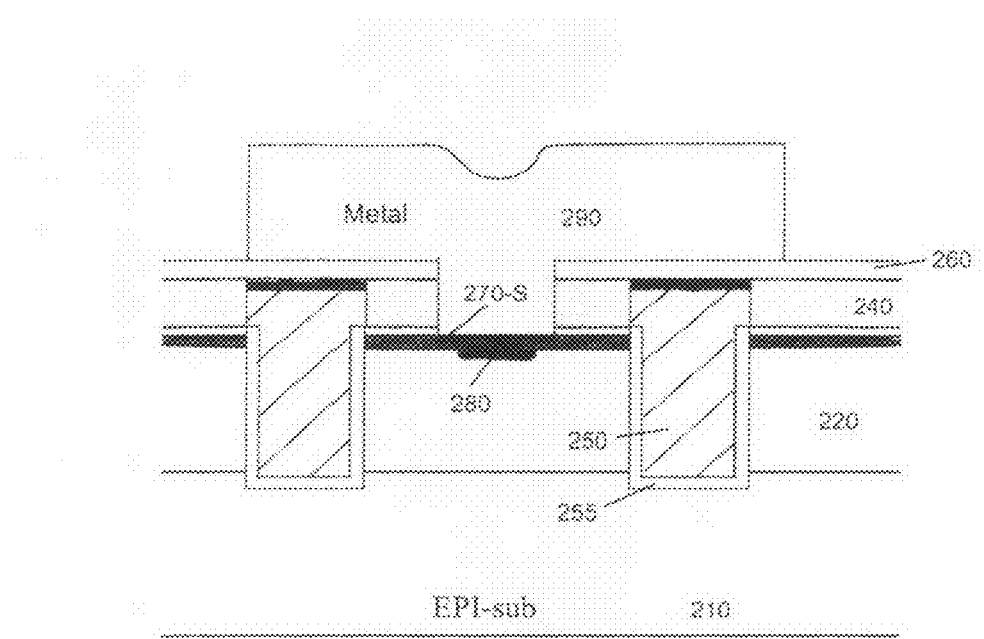
Figure 3V:
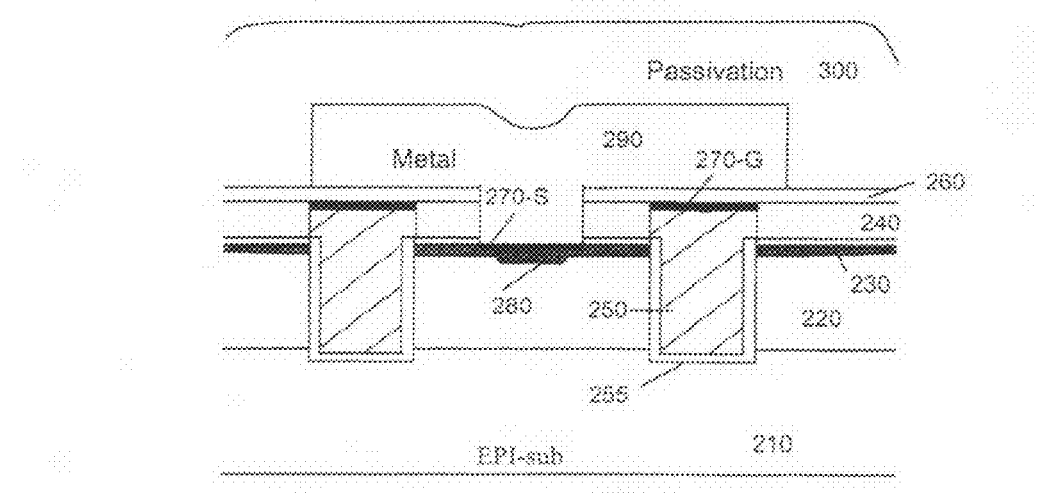

Referring to FIGS. 3A to 3V for a serial of side cross sectional views to illustrate the fabrication steps of a MOSFET device as that shown in FIG. 2. In FIG. 3A, pad oxide layer 205 is grown on a substrate supporting an epitaxial layer 210. A body mask 215 is then applied to implant body dopant ions 225 to form a body dopant region 220. In FIG. 3B, the body mask 215 is removed and the top surface of the substrate is cleaned. The fabrication process proceeds with a body dopant drive-in operation to form the body region 220 by applying an elevated temperature. In FIG. 3C, a source mask 235 is employed to implant source dopant ions 245 to form the source dopant region 230. In FIG. 3D, the photoresist 235 is removed and the top surface is cleaned. Then a low-pressure chemical vapor deposition (LPCD) nitride or a LPCVD oxide is deposited to form a hard mask 240. The pad oxide serves the function to protect the epitaxial layer 210. Furthermore, the epitaxial layer 210 does not go through a high temperature oxidation process. Therefore, the epitaxial layer 210 is not consumed in the process of forming the hard mask layer 240. Thus the intrinsic device breakdown voltage would not be impacted. In FIG. 3E, a trench mask 248 is applied and a photolithographic etch is carried out to etch the hard mask 240 and the pad oxide 205. In FIG. 3F, a trench etch is performed to open a plurality of trenches 249 into the body regions 220 and the epitaxial layer 210. In FIG. 3G, the trench mask 248 is removed and a sacrificial oxidation is performed followed by a sacrificial etch to remove the damages from the wall surface of the trenches 249. Then an elevated temperature is applied to grow a gate oxide layer 255. The high temperature also serves to drive in the source regions 230.

In FIG. 3H, a polysilicon layer 250 is formed filling into the trenches 249 and also covering the top surface. The polysilicon layer 250 is implanted and the dopants are activated with a rapid thermal annealing (RTA) process. In FIG. 3I, the polysilicon gate is then etched back to remove the top portion of polysilicon covering the top surface. Then a sputtering operation is carried out to form a titanium layer 258 covering the top surface as shown in FIG. 3J. A first rapid thermal annealing (RTA) process is carried out in FIG. 3K to form the TiSi layer 258-M on top of the polysilicon gate 250 and the un-reacted titanium is removed. The fabrication process continues with the deposition of an isolation oxide layer 260 as shown in FIG. 3L. Careful selection of the isolation material and thickness is important for high voltage isolation between the gate 250 and the source body region 230 and 220. The a contact mask 268 is formed on top over the isolation oxide layer 260 and the contact mask 268 has openings both at the mesa contact area as shown and at the gate that is not explicitly shown. Then, a photolithographic exposure is performed. In FIG. 3M, an isolation oxide etch is first performed followed by a hard mask etch and a pad oxide etch on the mesa contact areas to form the contact openings through the isolation oxide layer 260, the hard mask layer 240 and the pad oxide layer 205. At the gate contact areas, the contact etch has high selectivity over the TiSi and polysilicon. After the long etch of the hard mask layer 240 and the pad oxide layer 205, the polysilicon layer at the gate contact areas may be exposed that will be salicided later with the mesa contact region as further described below.

In FIG. 3N, the contact mask 268 is removed and a second titanium layer 270 is deposited. Then a first RTA process is performed to form the TiSi on the mesa contact areas, i.e., TiSi layer 270-M as shown in FIG. 3O. The TiSi layer 258-M over the gate and gate contact areas as shown in FIG. 3O remains unchanged by this RTA. The un-reacted titanium is removed. A second RTA process is performed to convert the TiSi layers, i.e., TiSi layer 270-M and 258-M, into a low-resistivity phase of TiSi2 layer 270-S and 270-G at both the mesa contact areas and the gate contact regions as shown in FIG. 3P. In FIG. 3P, a spacer nitride layer 275 is formed on the top surface followed by carrying out a nitride spacer etch to form the spacer 275-S as shown in FIG. 3Q. In FIG. 3R, multiple blank contact implantations with contact dopant ions of multiple energy levels are carried out through the TiSi2 layers 270-S to form the body contact region 280. There may be misalignments of the source mask and diffusion of the source dopant ions into the body contact regions. The contact dopant implantations can overcompensate the source doping to correct the misaligned and diffusion of the source dopant ions into the body regions. Conductive paths are established to the body and the salicided body contacts are now in electrical contact with the source regions by the salicides. The dopant ions implanted through these multiple contact implantations are confined by the spacers 275-S and are kept at distance away from the channel regions. Then a RTA process is applied to activate the contact dopant at a relative lower temperature, e.g., 900° C., to maintain the integrity of the TiSi2 layers. In FIG. 3S, the spacers 275-S are removed and the metal contact areas to the source salicided regions 270-S are further increased. In FIG. 3T, a thick metal layer 290 is deposited followed by applying a metal mask to carry out a photolithographic exposure. Then, a metal etch is performed as shown in FIG. 3U to pattern the metal layer 290 followed by forming a passivation layer 300 as a protective layer over the top surface of the device to complete the manufacturing processes.

In a preferred embodiment, this invention discloses a method for manufacturing a trenched semiconductor power device. The method includes a step of forming a first salicided layer on top of a trenched gate with a first salicided process. The method further includes another step of forming a second salicided layer in a mesa area on top of a source-body region next to the trenched gate whereby a gate resistance and a body contact resistance and source contact resistance are reduced. In a preferred embodiment, the method further includes a step of implanting contact dopant ions through the second salicided layer into the body contact region for providing enhanced electrical contact of the second salicided layer to the body region. In another preferred embodiment, the steps of forming the first and second salicided layers further comprising a step of converting the salicided layers into a low resistivity TiSi2 layer. In another preferred embodiment, the method further includes a step of implanting contact dopant ions of multiple energy levels through the second salicided layer into the body contact region for providing enhanced electrical contact of the second salicided layer to the source and body regions. In another preferred embodiment, the step of forming the first salicided layer on top of the trenched gate comprising a step of sputtering a titanium layer followed by a rapid thermal annealing (RTA) process. And, the step of forming second salicided layer comprising a step of etching contact openings through a hardmask layer with a contact mask and depositing a second titanium layer in the contact openings followed by carrying out a first and a second RTA processes. In another preferred embodiment, the method further includes a step of forming a spacer layer on a top surface and etching back the spacer layer to form spacers along sidewalls of the contact openings. And, the method further includes a step of implanting contact dopant ions of multiple energy levels through openings between the spacers and through the second salicided layer into the body-source region for providing enhanced electrical contact of the second salicided layer to the source-body region.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a trenched semiconductor power device comprising:
    forming a gate metallic contact layer on top of a trenched gate filled with a polysilicon; and
    opening a source contact opening through a protection insulation layer and in a mesa area on top of a source-body region next to said trenched gate and forming a source metallic contact layer covering sidewalls and a bottom surface of said source contact opening followed by carrying cut a rapid thermal annealing (RTA) process to form a salicided gate contact layer on top of the trenched gate and a salicided source contact layer on the bottom surface of the source contact opening surrounded by sidewalls of said source contact opening opened through said protection insulation layer whereby a gate resistance, a body contact resistance and a source contact resistance are reduced.

2. The method of claim 1 further comprising:
    implanting contact dopant ions through said source contact opening into a body contact region to form a source contact dopant region below said source contact opening before carrying out said RTA process in forming said salicided source contact layer for providing enhanced electrical contact of said salicided source contact layer to said body region.

3. The method of claim 1 wherein:
    said steps of forming said salicided gate contact layer and said salicided source contact layer further comprising a step of converting said salicided gate contact layer and said salicided source contact layer with a low resistivity TiSi2 layer.

4. The method of claim 1 further comprising:
    implanting contact dopant ions of multiple energy levels through said source contact opening into a body contact region to form a source contact dopant region below said source contact opening before carrying out said RTA process in forming said salicided source contact layer for providing enhanced electrical contact of said salicided source contact layer to said body region.

5. The method of claim 1 wherein:
    said step of forming said metallic gate contact layer on top of said trenched gate comprising a step of sputtering a titanium layer; and
    said step of forming metallic source contact layer comprising a step of depositing a second titanium layer covering the bottom surface and sidewalls of said source contact openings followed by carrying out said RTA process.

6. The method of claim 1 further comprising:
    forming a nitride spacer layer on a top of the protection insulation layer after opening the source contact opening and etching back said spacer layer to form spacers along sidewalls of said contact openings; and
    implanting contact dopant ions of multiple energy levels through openings between said spacers into said body-source region below the bottom surface of the source contact opening for providing enhanced electrical contact of said salicided source contact layer to said source-body region.

* * * * *